United States Patent
Marom et al.

(10) Patent No.: US 11,127,438 B1
(45) Date of Patent: Sep. 21, 2021

(54) BACKGROUND INTERFACE TRAINING USING SECONDARY SENSES

(71) Applicant: Western Digital Technologies, Inc., San Jose, CA (US)

(72) Inventors: Dor Marom, Kfar-Saba (IL); Shai Baron, Ramat-Hasharon (IL); Gadi Vishne, Petach-Tikva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/904,255

(22) Filed: Jun. 17, 2020

(51) Int. Cl.
*G11C 7/04* (2006.01)
*G11C 7/10* (2006.01)
*G06F 13/16* (2006.01)

(52) U.S. Cl.
CPC ............ *G11C 7/04* (2013.01); *G06F 13/1689* (2013.01); *G11C 7/1072* (2013.01); *G11C 7/1078* (2013.01); *G11C 2207/2254* (2013.01)

(58) Field of Classification Search
CPC ....... G11C 7/04; G11C 7/1072; G11C 7/1078; G11C 2207/2254; G06F 13/1689
See application file for complete search history.

(56) References Cited

U.S. PATENT DOCUMENTS

| | | | |
|---|---|---|---|
| 6,581,017 B2 | 6/2003 | Zumkehr | |
| 9,640,277 B2 | 5/2017 | Bonen et al. | |
| 10,147,481 B2 | 12/2018 | Kim | |
| 10,148,416 B2 | 12/2018 | Morris et al. | |
| 10,325,633 B2 * | 6/2019 | Lee | G11C 29/022 |
| 2006/0193195 A1 * | 8/2006 | Hur | G11C 7/222 365/189.05 |

(Continued)

OTHER PUBLICATIONS

H. Werkmann, D. Kim and S. Fujita, "GDDR5 Training—Challenges and Solutions for ATE-Based Test," 2008 17th Asian Test Symposium, Hokkaido, Japan, 2008, pp. 423-428, doi: 10.1109/ATS.2008.67. (Year: 2008).*

(Continued)

*Primary Examiner* — Ajay Ojha
(74) *Attorney, Agent, or Firm* — Patterson & Sheridan, LLP; Steven H. Versteeg

(57) ABSTRACT

The present disclosure generally relates to calibrating the communication with a memory device. To ensure proper calibration, interface training (IFT) needs to occur. IFT involves aligning the sampling point, which is an inflection point, of a clock signal with a data signal. The sampling point of the clock (i.e., the clock edge) needs to be located within the valid window of the data signal. The valid window of the data signal is the time in which the signal is guaranteed to be stable, i.e., after the signal has finished the signal transition time. If the sampling point is aligned with the inflection point of the data signal, then the data signal is not properly aligned. If the sampling point is aligned with the rising or falling edge of the data signal, the data may be obtained, but the data signal is misaligned and is dangerously close to being unreadable. To ensure properly aligning of the clock signal with the data signal, either additional clock signals or a faster clock signal can be used to ensure that misaligned data signals are identified and then properly aligned.

20 Claims, 6 Drawing Sheets

(56) References Cited

U.S. PATENT DOCUMENTS

2010/0315142 A1* 12/2010 Zerbe .................. H04L 7/10
                                                327/161
2019/0187929 A1   6/2019 Srivastava et al.
2019/0212769 A1   7/2019 Carlough et al.

OTHER PUBLICATIONS

A. Hu and F. Yuan, "Intersignal Timing Skew Compensation of Parallel Links With Voltage-Mode Incremental Signaling," in IEEE Transactions on Circuits and Systems I: Regular Papers, vol. 56, No. 4, pp. 773-783, Apr. 2009, doi: 10.1109/TCSI.2008.2002655. (Year: 2009).*

Jeongpyo Kim et al., "A 500 Mb/s/pin quadruple data rate SDRAM interface using a skew cancellation technique," 2000 IEEE International Solid-State Circuits Conference. Digest of Technical Papers (Cat. No. 00CH37056), San Francisco, CA, USA, 2000, pp. 404-405, doi: 10.1109/ISSCC.2000.839835. (Year: 2000).*

J. Chae, H. Ko, J. Park and S. Kim, "A 12.8-Gb/s Quarter-Rate Transmitter Using a 4:1 Overlapped Multiplexing Driver Combined With an Adaptive Clock Phase Aligner," in IEEE Transactions on Circuits and Systems II: Express Briefs, vol. 66, No. 3, pp. 372-376, Mar. 2019. (Year: 2019).*

* cited by examiner

BACKGROUND INTERFACE TRAINING USING SECONDARY SENSES

BACKGROUND OF THE DISCLOSURE

Field of the Disclosure

Embodiments of the present disclosure generally relate to calibrating the communication with a memory device.

Description of the Related Art

The time that it takes to perform a calibration of the communication against a memory device, such as a NAND chip, is significant. The interface training (IFT) involves holding the data path for the time that it takes to complete the training.

For IFT read training, initially pre-defined data is written to the memory device buffers/latches using a low bus speed. To look at the data, a left edge alignment for all data channels is performed by reading 4 KB data from the memory device in high speed and comparing the 32 bytes of the 4 KB while searching for a valid reading of the data with the left-most delay for all data channels. After every reading, the delay is incremented/decremented once. It is to be understood that the data in the NAND chip may be defined by a command or by any other method, and not necessarily a slow transfer rate.

Then, a left edge alignment for each data channel is performed by reading the data from the memory device in high speed and comparing 32 bytes while searching for a valid reading of the data with the left-most delay for each data channel. After every reading, the delay is incremented/decremented once.

Finally, the right edge alignment for all data channels is performed by reading the data from the memory device in high speed and comparing 32 bytes while searching for a valid reading of the data with the right-most delay for all data channels. After every reading, the delay is incremented/decremented once. Based upon the left edge alignment and the right edge alignment, the sampling point for the data is set to the middle of the left and right edges.

As noted above, IFT takes a long time. To save time, the IFT can be triggered only when a significant temperature change is observed or the bit error rate (BER) is too high. However, if the IFT is used only when there is a significant temperature change or a high BER, then data that is not aligned for other reasons may remain misaligned.

Therefore, there is a need for a faster IFT that can ensure that the data is properly aligned.

SUMMARY OF THE DISCLOSURE

The present disclosure generally relates to calibrating the communication with a memory device. To ensure proper calibration, interface training (IFT) needs to occur. IFT involves aligning the sampling point, which is an inflection point, of a clock signal with a data signal. The sampling point of the clock (i.e., the clock edge) needs to be located within the valid window of the data signal. The valid window of the data signal is the time in which the signal is guaranteed to be stable, i.e., after the signal has finished the signal transition time. If the sampling point is aligned with the inflection point of the data signal, then the data signal is not properly aligned. If the sampling point is aligned with the rising or falling edge of the data signal, the data may be obtained, but the data signal is misaligned and is dangerously close to being unreadable. To ensure properly aligning of the clock signal with the data signal, either additional clock signals or a faster clock signal can be used to ensure that misaligned data signals are identified and then properly aligned.

In one embodiment, a data storage device comprises: a memory device; and a controller coupled to the memory device, wherein the controller is configured to: sensing with a plurality of separate and distinct clock or data signals from the memory device; receive data from each data signal from the memory device; determine whether any data from any data signal is not aligned with a sampling point of at least one clock signal from the controller; and align any misaligned data signal with the sampling point of at least one clock signal from the controller.

In another embodiment, a data storage device comprises: a memory device; and a controller coupled to the memory device, wherein the controller is configured to: sense a data signal from the memory device using a clock signal from the controller, wherein the clock signal has a sampling point, a first rising portion, a first eye portion, and a first falling portion, wherein each data signal has an inflection point, a second rising portion, a second eye portion, and a second falling portion, wherein the second eye portion is larger than the first eye portion; receive data from each data signal from the memory device; determine whether any second eye portion is not aligned with the sampling point of the clock signal; and insert a delay into any misaligned data signal to align the misaligned data signal with the sampling point.

In another embodiment, a data storage device comprises: a memory device; means to compare a plurality of sampling points from a clock signal to a single eye portions of a data signal; and means to delay the data signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to calibrating the communication with a memory device. To ensure proper calibration, interface training (IFT) needs to occur. IFT involves aligning the sampling point, which is an inflection point, of a clock signal with a data signal. The sampling point of the clock (i.e., the clock edge) needs to be located within the valid window of the data signal. The valid window of the data signal is the time in which the signal is guaranteed to be stable, i.e., after the signal has finished the signal transition time. If the sampling point is aligned with the inflection point of the data signal, then the data signal is not properly aligned. If the sampling point is aligned with the rising or falling edge of the data signal, the data may be obtained, but the data signal is misaligned and is dangerously close to being unreadable. To ensure properly aligning of the clock signal with the data signal, either additional clock signals or a faster clock signal can be used to ensure that misaligned data signals are identified and then properly aligned.

Figure 1:
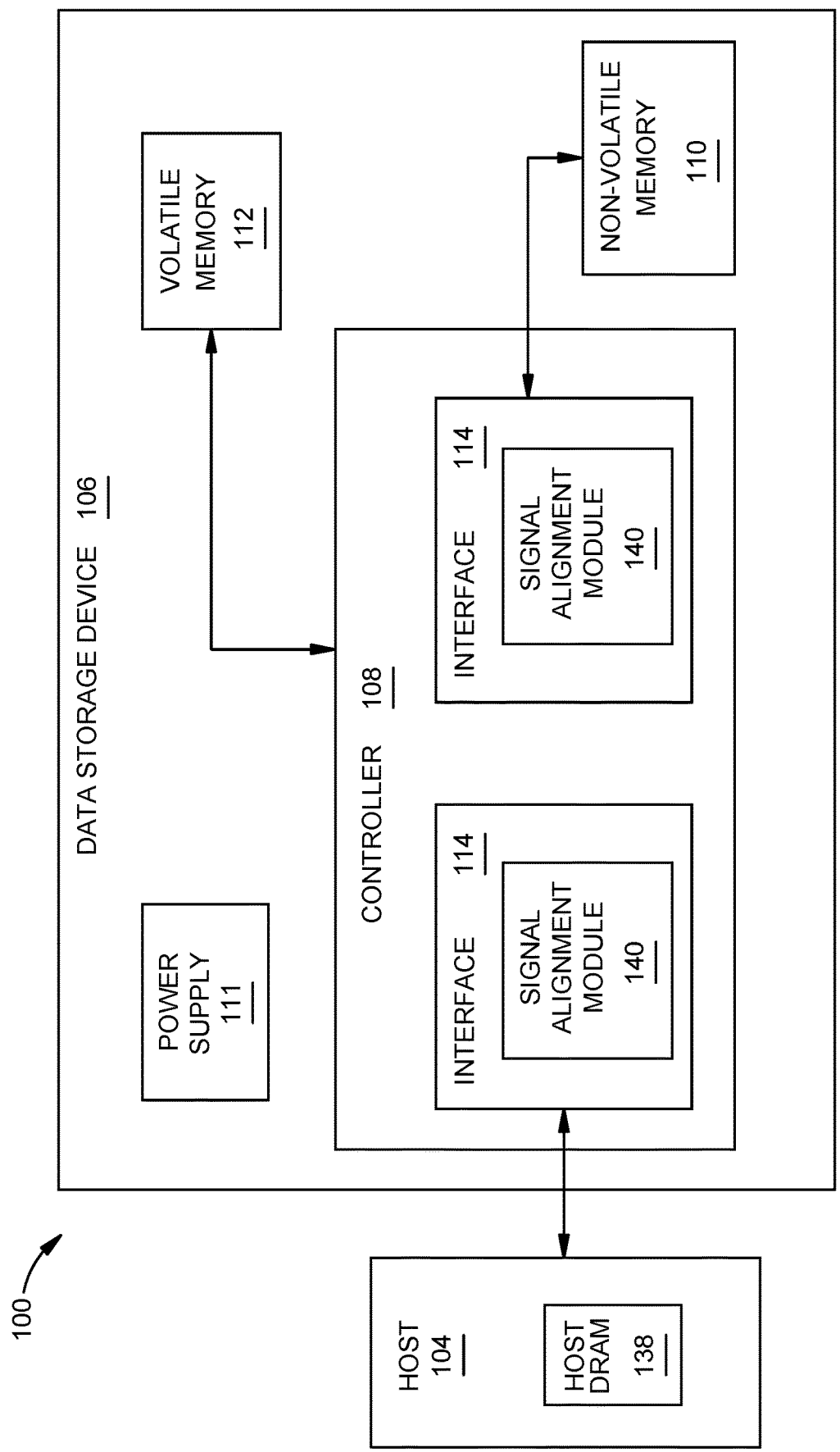
FIG. 1 is a schematic block diagram illustrating a storage system in which storage device may function as a storage device for a host device, in accordance with one or more techniques of this disclosure.

FIG. 1 is a schematic block diagram illustrating a storage system 100 in which a data storage device 106 may function as a storage device for a host device 104, in accordance with one or more techniques of this disclosure. For instance, the host device 104 may utilize non-volatile memory 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104 which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The data storage device 106 includes a controller 108, non-volatile memory 110 (NVM 110), a power supply 111, volatile memory 112, a signal alignment module 140, and an interface 114. The controller 108 comprises an internal memory or buffer (not shown). In some examples, the data storage device 106 may include additional components not shown in FIG. 1 for sake of clarity. For example, the data storage device 106 may include a printed board (PB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The data storage device 106 includes NVM 110, which may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. Flash memory devices may include NAND or NOR based flash memory devices, and may store data based on a charge contained in a floating gate of a transistor for each flash memory cell. In NAND flash memory devices, the flash memory device may be divided into a plurality of blocks which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices, and may be single level cell (SLC), multi-level cell (MLC), triple level cell (TLC), or quad level cell (QLC). The controller 108 may write data to and read data from NAND flash memory devices at the page level and erase data from NAND flash memory devices at the block level.

Likewise, an NVMe namespace is a quantity of NVM 110 that can be formatted into logical blocks. Namespaces are used when a storage virtual machine is configured with an NVMe protocol. A namespace ID (NSID) is an identifier used by a controller 108 to provide access to an NVMe namespace. An NVMe namespace logical block can only be mapped to a single NVM location at a time. Furthermore, each NVM location does not have identical or duplicate NSIDs.

The data storage device 106 includes a power supply 111, which may provide power to one or more components of the data storage device 106. When operating in a standard mode, the power supply 111 may provide power to the one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may be comprised of one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory before sending the data to the NVM 110.

The data storage device 106 further includes a signal alignment module 140. In one embodiment, the signal alignment module 140 is hardware designed to handle signal alignment when data is received. It is contemplated that the signal alignment module 140 may be firmware. The signal alignment module 140 may be configured to utilize logic to determine signal modifications to an input data signal. Causes of signal misalignment may include vibrations, temperature variations, and any other causes of signal misalignment not listed. Such signal modifications may be time shift, frequency shift, and any other suitable signal modifications to align the data signal.

Figure 2:
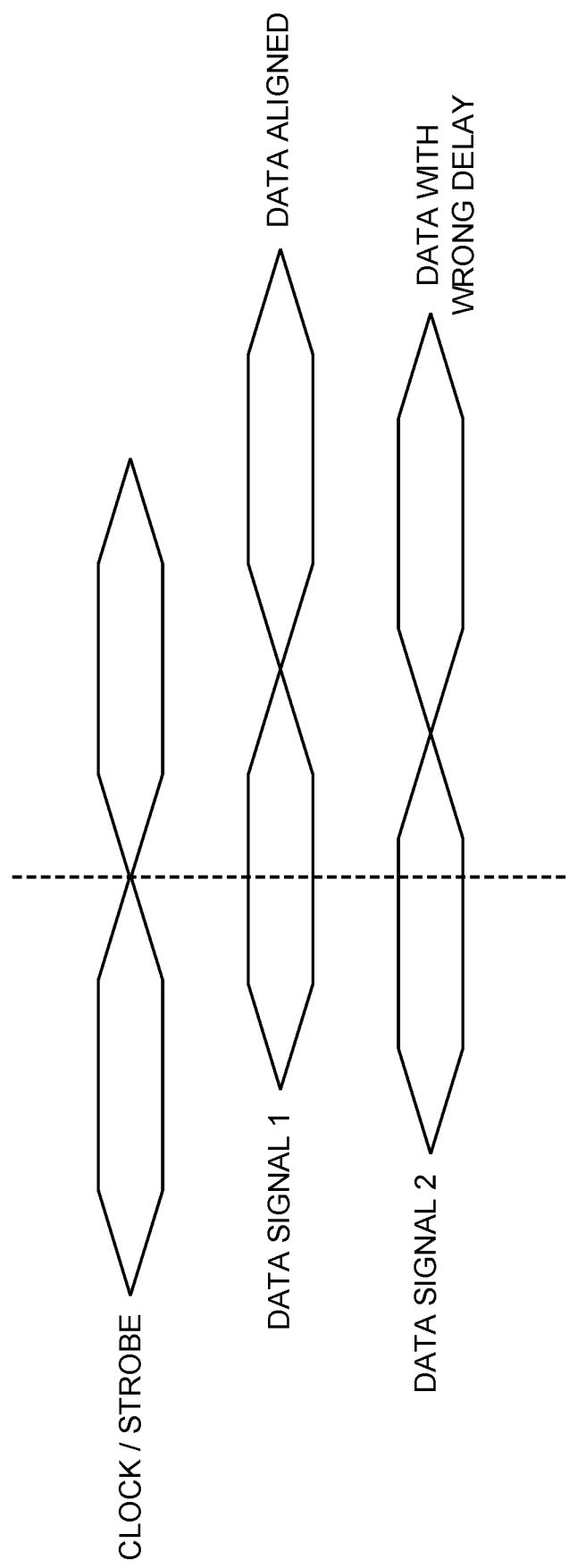
FIG. 2 is a schematic illustration of data sensing according to one embodiment.

FIG. 2 is a schematic illustration of data sensing according to one embodiment. Aspects of storage system 100 of FIG. 1 will be utilized in accordance with FIG. 2. FIG. 2 illustrates a first clock/sense strobe signal, a first data signal, and a second data signal. It is to be understood that the terms "data signal" and "clock data signal" are used interchangeably throughout the disclosure. The inflection point between the rising/falling edges of the first clock/sense strobe signal signifies the sampling point. The sampling point is a point in which data is read. However, if the sampling point does not match the valid window of a data signal, read errors may occur. Read errors may be misaligned bits, bits of the previous or following read sequence, or any other causes of read errors not listed. The dashed line in FIG. 2 shows the alignment of the sampling point in the clock/strobe signal, data signal 1, and data signal 2.

The first data signal and the second data signal may be identical in one embodiment. The data signals are aligned with each other so that one signal is sent after another without a gap in transfer. The first data signal is aligned with the clock/sense strobe signal, whereas the second data signal is misaligned (i.e., has the wrong delay) with the clock/sense strobe signal. An aligned data signal occurs when the valid window of the data signal matches the inflection point of the clock/strobe signal (i.e., the signals are 180 degrees from each other).

However, the second data signal is misaligned from the clock/strobe signal, indicating a wrong signal delay. In order to adjust the data signal, the normal operation of the storage device is paused so that the signal alignment module 140 or the controller 108 of FIG. 1 is able to determine the correct clock signal offset or delay. The correct clock signal offset or delay is determined by sending pad data in the same frequency to the NAND through multiple iterations to match the inflection point of the clock signal with the pad data signal. When the sampling point matches the center or middle of the pad data signal, normal device operations resumes until the clock/strobe signal is misaligned with the center or middle of the data signal.

Figure 3:
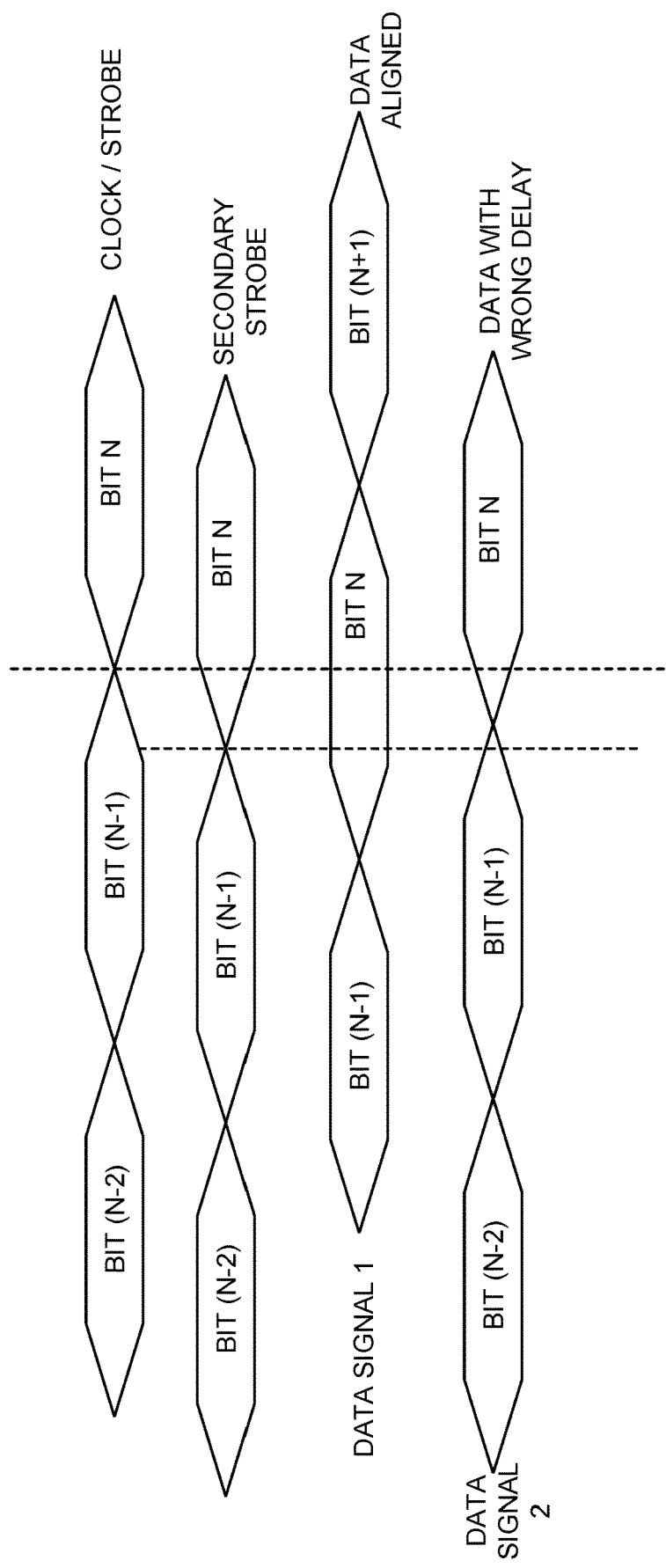
FIG. 3 is a schematic illustration of data sensing according to another embodiment.

FIG. 3 is a schematic illustration of data sensing according to another embodiment. Aspects of storage system 100 of FIG. 1 will be utilized in accordance with FIG. 3. FIG. 3 illustrates a first clock/sense strobe signal, a second or secondary strobe signal, a first data signal, and a second data signal. The inflection point of the first clock/sense strobe signal signifies the sampling point. The sampling point is a point in which data is read. However, if the sampling point does not match the valid window of a data signal, read errors may occur. Read errors may be misaligned bits, bits of the previous or following read sequence, or any other causes of read errors not listed.

The first data signal and the second data signal may be identical in one embodiment. The data signals are aligned with each other so that one signal is sent after another without a gap in transfer. The first data signal is aligned with the clock/sense strobe signal, whereas the second data signal is misaligned (i.e., has the wrong delay) with the clock/sense strobe signal. An aligned data signal occurs when the valid window of the data signal matches the inflection point of the clock/strobe signal (i.e., the signals are 180 degrees from each other). However, the second data signal is misaligned from the clock/strobe signal, indicating a wrong signal delay.

The second strobe signal may be an indicator to the signal alignment module, such as the signal alignment module 140 of FIG. 1, of the offset or the delay required to align the data signal. The second strobe signal may be a strobe from a secondary source (i.e., a second clock) or a second strobe from the same source as the primary source (i.e., a first clock). The signal alignment module 140 may utilize the first clock/strobe signal and the second strobe signal to calculate the offset or the delay needed to realign the data signal. The offset or the delay may be calculated by comparing the second strobe signal to the first strobe signal, identifying the window of the relevant data signal, and setting the correct delay to align the first strobe signal to the data signal. In one embodiment, the signal alignment module may adjust the second strobe signal without pausing device operation.

Figure 4:
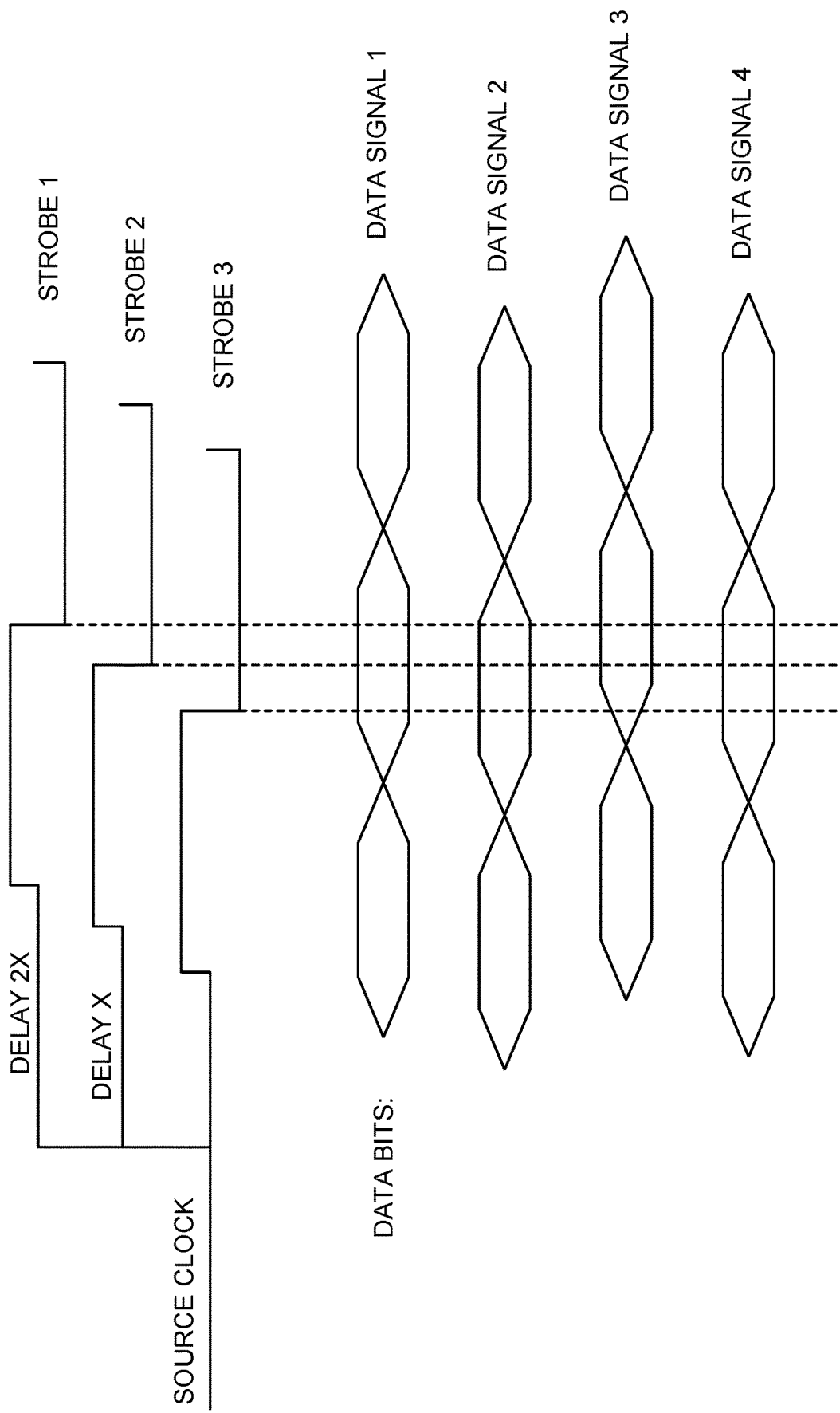
FIG. 4 is a schematic illustration of data sensing according to another embodiment.

FIG. 4 is a schematic illustration of data sensing according to another embodiment. Aspects of storage system 100 of FIG. 1 will be utilized in accordance with FIG. 4. In one embodiment, the signal alignment module 140 may utilize two or more strobe signals with different delays to determine an offset or a delay to align the data signal. In another embodiment, a plurality of strobe signals may originate from a first clock. It is to be understood that while a single clock is shown to generate the plurality of strobe signals, it is contemplated that a plurality of clocks may be used to create the plurality of strobe signals.

FIG. 4 illustrates a single source clock with three different of clock/strobe signals each modified by a delay. Strobe 1 has a delay of 2x, strobe 2 has a delay of x, and strobe 3 does not have a delay. The variable "x" refers to an interval of time that the strobe signal is delayed. For example, x may be 2 seconds, where the strobe signal 1 is delayed 4 seconds from the original strobe signal 3 and the strobe signal 2 is delayed 2 seconds from the original strobe signal 3. Furthermore, FIG. 4 illustrates four data signals, data signal 1, data signal 2, data signal 3, and data signal 4, which may be identical to each other or different from each other. In the current embodiment, the four data signals are identical to each other with a delay or an offset.

In FIG. 4, the strobe signal 2 is aligned with the data signal 1, whereas the strobe signal 1 and the strobe signal 3 are slightly misaligned with the data signal 1. However, the slight misalignment, while not ideal, will still return proper data for each of strobe 1-3 because the sampling point for each of strobes 1-3 is within the "eye" of data signal 1. It should be noted, however, that because strobes 1 and 3 are not perfectly aligned with the data signal 1, the signal alignment module 140 may align data signal 1, but because strobe 2 is perfectly aligned with data signal 1, realignment of data signal 1 is not necessary. More specifically, the signal alignment module 140 does not need to align because the signal alignment module 140 senses the same value in all three strobes. However, consider the situation where strobe 1 senses a different value for the same sample as strobes 2 and 3. In such a situation, the signal alignment module should align the corresponding data channel in the direction of strobe 3 (i.e., changing the delay of the data channel to the right). Now consider the situation where strobe 3 senses a different value for the same sample as strobes 1 and 2. In such a situation, the signal alignment module should align the corresponding data channel in the direction of strobe 1 (i.e., changing the delay of the data channel to the left). Therefore, if a strobe samples a different value than the other two strobes, the strobe location relative to the other strobes needs to be considered.

In regards to data signal 2, strobe signal 1, strobe signal 2, and strobe signal 3 will return valid data even though no single signal is perfectly aligned with data signal 2. In particular, strobe signal 1 is on the falling edge of data signal 2. Strobe signals 1 and 2 are still within the "eye" of data signal 2 and thus, realignment of data signal 2 is not necessary. However, it is contemplated that the signal alignment module 140 may align data signal 2. The signal alignment module 140 will recognize that both strobe signal 1 and strobe signal 2 are closer to the right rising/falling edge of the relevant section of the data signal 2. The signal alignment module 140 will recognize that strobe signal 3 is not perfectly aligned with the middle of the "eye" of data signal 2.

In regards to data signal 3, strobe signal 1 is aligned with the middle of the "eye" of data signal 3. Strobe signal 2 and strobe signal 3 are misaligned with the data signal 3. Specifically, strobe signal 3 aligns with the rising/falling edge of data signal 3. Strobe signal 2, while still within the "eye" of data signal 3, is not perfectly aligned. By sampling a different value with strobe 3 than with strobes 1 and 2, the signal alignment module 140 detects strobe 3 to be close to the left rising/falling edge of data signal 3. If all strobes sample the same value, then no alignment operation is necessary. However, if any one strobe senses a different value from another strobe, then an alignment operation is performed to shift the data signal. It is contemplated that the signal alignment module 140 may perform an alignment to ensure all strobes are closer to the middle of the valid window of data signal 3.

In regards to data signal 4, each strobe signal, strobe signal 1, strobe signal 2, and strobe signal 3 is aligned with the data signal 4, though no strobe signal is perfectly aligned. By sampling a different value with strobe 1 than with strobes 2 and 3, the signal alignment module 140 detects strobe 1 to be close to the right rising/falling edge of data signal 4. If all strobes sample the same value, then no alignment operation is necessary. However, if any one strobe senses a different value from another strobe, then an alignment operation is performed to shift the data signal. It is contemplated that the signal alignment module 140 may perform an alignment to ensure all strobes are closer to the middle of the valid window of data signal 4.

Figure 5:
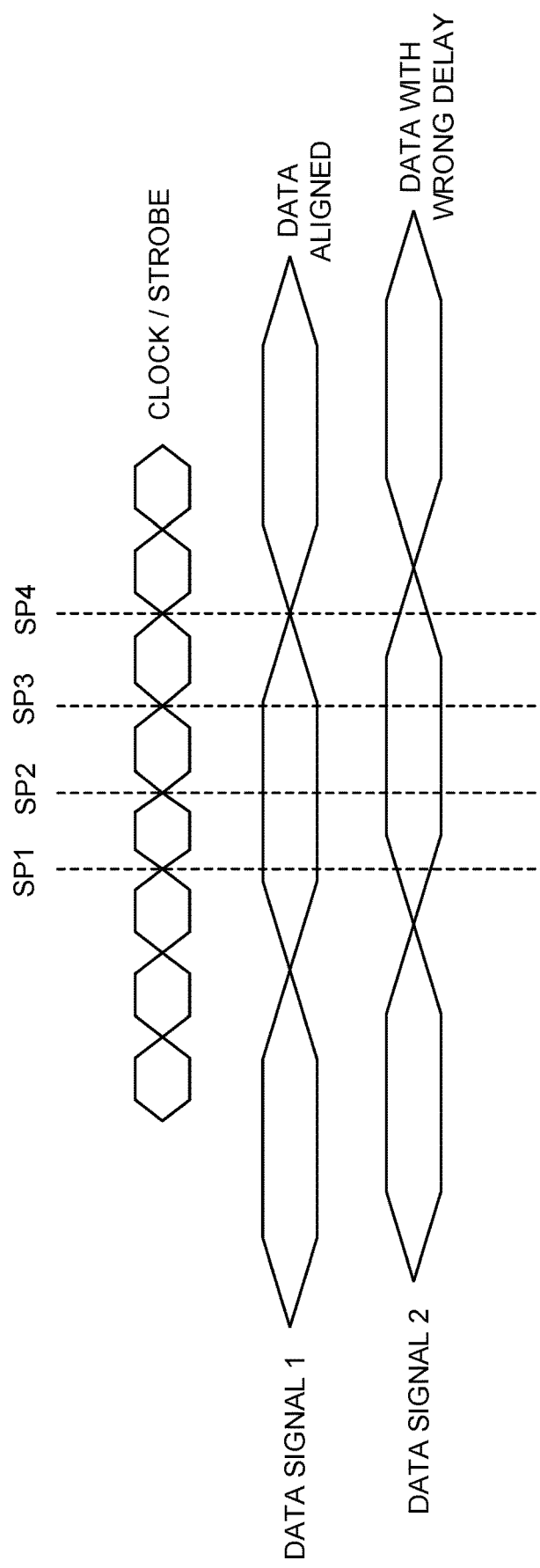
FIG. 5 is a schematic illustration of data sensing according to another embodiment.

FIG. 5 is a schematic illustration of data sensing according to another embodiment. Aspects of storage system 100 of FIG. 1 will be utilized in accordance with FIG. 5. FIG. 5 illustrates a clock/strobe signal occurs at a higher frequency than that of the clock/strobe signal illustrated in FIG. 2, FIG. 3, and FIG. 4. Unlike the clock/strobe signal in FIG. 4, where the clock/strobe signal is adjusted by incorporating various offsets or various delays, the clock/strobe signal of FIG. 5 occurs at a higher frequency, resulting in more sampling points for the same clock/strobe signal within the same period. Furthermore, by having a higher clock/strobe frequency, the calibration of the signal alignment module 140 may increase allowing for increased recognition of unaligned data signals or boundary sections (i.e., rising/falling edge of the data signal sections) of the data signal.

In one embodiment, the frequency of the clock/strobe signal may be lower than the original clock/strobe signal. In another embodiment, the frequency of the clock/strobe signal may be higher than the original clock/strobe signal.

In FIG. 5, the sampling points are denoted as SP, where the clock/strobe signal has a first SP1, a second SP2, a third SP3, and a fourth SP4. The data signal 1 is aligned with the clock/strobe signal. Of the four sampling points, SP2 matches the middle of the relevant section of the data signal 1. The data signal 2 is unaligned with the clock/strobe signal due to a wrong delay (i.e., the sampling points do not coincide with the middle of the relevant section of the data signal 2).

The signal alignment module, such as the signal alignment module 140 of FIG. 1, registers the placement of each sampling point within the relevant sections of the data signal 2. The signal alignment module 140 determines that SP1 and SP2 are towards the beginning of the relevant section of the data signal 2 and that SP3 and SP4 are towards the end of the relevant section of the data signal 2.

The signal alignment module 140 may incorporate a delay to offset the clock/strobe signal to align one of the sampling points, SP1-SP4, with the data signal 2. For example, the signal alignment module 140 may delay the data signal 2 by "x", where "x" is a predetermined amount of time, so that SP3 is aligned with the middle of the relevant section of the data signal 2. Likewise, the signal alignment module 140 may delay the data signal 2 by "x+y", where "x" and "y" are predetermined amounts of time, so that SP4 is aligned with the middle of the relevant section of the data signal 2. In one embodiment, the signal alignment module 140 may dynamically change the delay of the clock/strobe signal to align a sampling point with the middle of the relevant section of the data signal based on the recognition of the boundary sections (i.e., rising/falling edge of the data signal sections) of the data signal.

Figure 6:
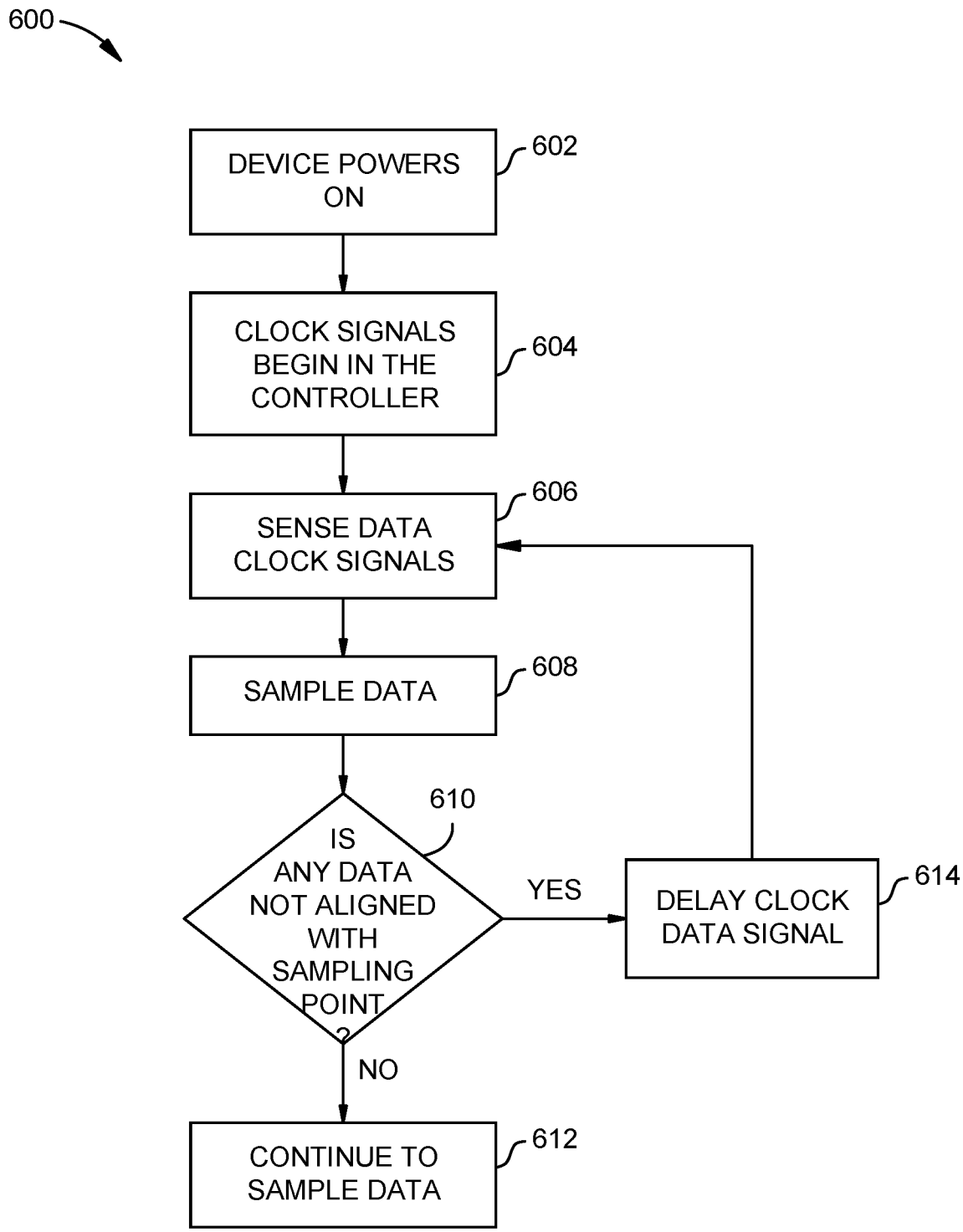
FIG. 6 is a flowchart of an interface training algorithm according to one embodiment.

FIG. 6 is a flowchart of an interface training algorithm according to one embodiment. Aspects of storage system 100 of FIG. 1 will be utilized in accordance with FIG. 6. The use of a signal alignment module 140 may allow for the continuous operation of the storage device while dynamically changing the delay or the offset of the data signal to the optimal sampling point area.

At block 602, the storage device powers on. At block 604, one or more clock signals begin in the controller. The clock signals may be the clock/strobe signals illustrated in FIG. 2, FIG. 3, FIG. 4, and FIG. 5. Data signals are sensed at block 606 corresponding with data inputs received by the storage device. The data signals may be the data signals illustrated in FIG. 2, FIG. 3, FIG. 4, and FIG. 5. At each sampling point (i.e., the inflection point of the clock signal) at block 608, the controller and/or the signal alignment module 140 determines if the data is aligned with the sampling point at block 610. The sampling point is matched with the center of a relevant section or "eye" of the data signal when the data is aligned. Conversely, when the data is unaligned, the center of a relevant section of the data signal is not matched with the sampling point.

If the data is not aligned with the sampling point of the clock signal at block 610, then the signal alignment module 140 and/or the controller set the delay of the data signal at 612 and repeats the interface training algorithm. The signal alignment module 140 may determine if a sampling point is close to a boundary of the relevant section (i.e., the rising/falling edge of the data signal) and adjust the delay or the offset accordingly to shift the center of the relevant section of the data signal to match the sampling point (i.e., the inflection point of the clock signal).

However, if the data signal is aligned with the sampling point of the clock signal at block 610, then the signal alignment module 140 and/or the controller continues to sample the data at block 612. Though the data signal may be aligned at a point in time, the data signal may become unaligned in the future as processes that cause data signal variations, such as temperature changes, occur as the storage device is in operation. When the signal alignment module 140 determines that the data signal is no longer aligned with the sampling points of the clock signal, the interface training algorithm utilized to realign the sampling point with the clock signal. The clock signal may be manipulated by adding various offsets or various delays to the clock signal and/or increasing the frequency of the clock signal. The data signal may be adjusted by adding an offset or a delay to the data signal.

By utilizing additional or faster clock signals, misaligned data signals can be identified easier and faster to enable the misaligned data signals to be properly aligned.

In one embodiment, a data storage device comprises: a memory device; and a controller coupled to the memory device, wherein the controller is configured to: sensing with a plurality of separate and distinct data signals from the memory device; receive data from each data signal from the memory device; determine whether any data signal from any data signal is not aligned with a sampling point of at least one clock signal from the controller; and align any misaligned data signal with the sampling point of at least one clock signal from the controller. The at least one clock signal comprises a first clock signal with a first plurality of sampling points and a second clock signal with a second plurality of sampling points. The first plurality of sampling points are misaligned from the second plurality of sampling points. The at least one clock signal comprises a plurality of separate and distinct clock signals that have staggered sampling points. Each data signal comprises a first potential rising/falling edge, a stable section, and a second potential rising/falling edge, wherein the determining comprises determining whether the sampling point is not aligned with the stable section. The controller is configured to add a delay to any misaligned data signal. The data storage device further comprises a signal alignment module. The signal alignment module is a hardware component of the controller.

In another embodiment, a data storage device comprises: a memory device; and a controller coupled to the memory device, wherein the controller is configured to: sense a data signal from the memory device using a clock signal from the controller, wherein the clock signal has a sampling point, a first rising portion, a first eye portion, and a first falling portion, wherein each data signal has an inflection point, a second rising portion, a second eye portion, and a second falling portion, wherein the second eye portion is larger than the first eye portion; receive data from each data signal from the memory device; determine whether any second eye portion is not aligned with the sampling point of the clock signal; and insert a delay into any misaligned data signal to align the misaligned data signal with the sampling point. The delay is set to align the sampling point with the second eye portion. The delay is set to align the sampling point with a center of the second eye portion. The determining and inserting occurs dynamically. A size of the first eye portion is adjustable. A plurality of data signals are present, and the delay comprises inserting a delay for less than all of the plurality of data signals. The determining comprises determining whether the second rising portion or the second falling portion is aligned with the sampling point.

In another embodiment, a data storage device comprises: a memory device; means to compare a plurality of sampling points from a clock signal to a single eye portions of a data signal; and means to delay the data signal. The clock signal has an eye portion that is smaller than eye portions of the data signal. The clock signal has an eye portion that is approximately a same size as an eye portion of the data signal. The data storage device further comprises a plurality of signal means. The data storage device further comprises means to divide a single clock signal into a plurality of clock signals, wherein the plurality of clock signals each have a sampling point that is misaligned from other sampling points.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
sense a plurality of separate and distinct data signals from the memory device;
receive a data signal from each data signal from the memory device;
determine whether any data from any data signal is not aligned with a sampling point of at least one clock signal of the controller; and
align any misaligned data signal with the sampling point of at least one clock signal of the controller, wherein the aligning comprises delaying the not aligned data signal.

2. A data storage device, comprising:
a memory device; and
a controller coupled to the memory device, wherein the controller is configured to:
sense a plurality of separate and distinct data signals from the memory device;
receive a data signal from each data signal from the memory device;
determine whether any data from any data signal is not aligned with a sampling point of at least one clock signal of the controller, wherein the at least one clock signal comprises a first clock signal with a first plurality of sampling points and a second clock signal with a second plurality of sampling points; and
align any misaligned data signal with the sampling point of at least one clock signal of the controller.

3. The data storage device of claim 2, wherein the first plurality of sampling points are misaligned from the second plurality of sampling points.

4. A data storage device, comprising:
a memory device; and
a controller coupled to the memory device, wherein the controller is configured to:
sense a plurality of separate and distinct data signals from the memory device;
receive a data signal from each data signal from the memory device;
determine whether any data from any data signal is not aligned with a sampling point of at least one clock signal of the controller, wherein the at least one clock signal comprises plurality of separate and distinct clock signals that have staggered sampling points; and
align any misaligned data signal with the sampling point of at least one clock signal of the controller.

5. A data storage device, comprising:
a memory device; and
a controller coupled to the memory device, wherein the controller is configured to:
sense a plurality of separate and distinct data signals from the memory device;
receive a data signal from each data signal from the memory device;
determine whether any data from any data signal is not aligned with a sampling point of at least one clock signal of the controller, wherein each clock or data signal comprises a first potential rising/falling edge, a stable section, and a second potential rising/falling edge, wherein the determining comprises determining whether the sampling point is not aligned with the stable section; and
align any misaligned data signal with the sampling point of at least one clock signal of the controller.

6. The data storage device of claim 1, wherein the controller is configured to add a delay to any misaligned data signal.

7. The data storage device of claim 1, wherein the data storage device further comprises a signal alignment module.

8. The data storage device of claim 7, wherein the signal alignment module is a hardware component of the controller.

9. A data storage device, comprising:
a memory device; and
a controller coupled to the memory device, wherein the controller is configured to:
sense a data signal from the memory device using a clock signal from the controller, wherein the clock signal has a sampling point, a first rising portion, a first eye portion, and a first falling portion, wherein each data signal has an inflection point, a second rising portion, a second eye portion, and a second falling portion, wherein the second eye portion is larger than the first eye portion;
receive data from each data signal from the memory device;
determine whether any second eye portion is not aligned with the sampling point of the clock signal; and
insert a delay into any misaligned data signal to align the misaligned data signal with the sampling point.

10. The data storage device of claim 9, wherein the delay is set to align the sampling point with the second eye portion.

11. The data storage device of claim 10, wherein the delay is set to align the sampling point with a center of the second eye portion.

12. The data storage device of claim 9, wherein the determining and inserting occurs dynamically.

13. The data storage device of claim 9, wherein a size of the first eye portion is adjustable.

14. The data storage device of claim 9, wherein a plurality of data signals are present and wherein inserting the delay comprises inserting a delay for less than all of the plurality of data signals.

15. The data storage device of claim 9, wherein the determining comprises determining whether the second rising portion or the second falling portion is aligned with the sampling point.

16. A data storage device, comprising:
a memory device;
means to compare a plurality of sampling points from a clock signal to a single eye portions of a data signal; and
means to delay the data signal.

17. The data storage device of claim 16, wherein the clock signal has an eye portion that is smaller than eye portions of the data signal.

18. The data storage device of claim 16, wherein the clock signal has an eye portion that is approximately a same size as an eye portion of the data signal.

19. The data storage device of claim 16, further comprising a plurality of clock signal means.

20. The data storage device of claim 16, further comprising means to divide a single clock signal into a plurality of clock signals, wherein the plurality of clock signals each have a sampling point that is misaligned from other sampling points.

\* \* \* \* \*